(12) United States Patent
Yoshida et al.

(10) Patent No.: US 7,466,017 B2
(45) Date of Patent: Dec. 16, 2008

(54) LASER APPARATUS AND METHOD FOR ASSEMBLING THE SAME

(75) Inventors: Takashi Yoshida, Kanagawa-ken (JP);
Kazuhiko Nagano, Kanagawa-ken (JP);
Yoji Okazaki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 357 days.

(21) Appl. No.: 11/385,905

(22) Filed: Mar. 22, 2006

(65) Prior Publication Data
US 2006/0239317 A1 Oct. 26, 2006

(30) Foreign Application Priority Data
Mar. 22, 2005 (JP) .............................. 2005-082180

(51) Int. Cl.
*H01L 33/00* (2006.01)
*H01L 23/02* (2006.01)

(52) U.S. Cl. ......................................... 257/678; 257/98

(58) Field of Classification Search ........... 257/88–103, 257/678
See application file for complete search history.

(56) References Cited

U.S. PATENT DOCUMENTS 7,101,094 B2 * 9/2006 Nagano et al. ................ 385/93
7,376,162 B2 * 5/2008 Nagano et al. ................ 372/34

FOREIGN PATENT DOCUMENTS

| EP | 0 631 164 A1 | 12/1994 |
|---|---|---|
| JP | 2003-347647 A | 12/2003 |
| JP | 2004-45667 A | 2/2004 |

* cited by examiner

*Primary Examiner*—Cuong Q Nguyen
(74) *Attorney, Agent, or Firm*—Sughrue Mion, PLLC (57) ABSTRACT

A laser apparatus includes: one or more semiconductor lasers emitting one or more laser beams; an optical fiber; an optical condensing system which makes the one or more laser beams enter the optical fiber from a light-entrance end of the optical fiber; and a package which fixedly contains the optical condensing system and the one or more semiconductor lasers, and fixedly holds the optical fiber in such a manner that the light-entrance end faces the optical condensing system. The one or more semiconductor lasers are directly or indirectly fixed to the package with solder, and the one or more optical components are directly or indirectly fixed to the package with a thin layer of adhesive having a thickness of less than or equal to 1 micrometer, and preferably a thickness within a range of 0.2 micrometers to 1 micrometer after being dried.

17 Claims, 9 Drawing Sheets

LASER APPARATUS AND METHOD FOR ASSEMBLING THE SAME

BACKGROUND OF THE INVENTION

1. Field of the Invention

The present invention relates to a laser apparatus in which one or more laser beams emitted from one or more semiconductor lasers contained in a package are optically combined in an optical fiber. The present invention also relates to a method for assembling the above laser apparatus.

2. Description of the Related Art

Some known types of laser apparatuses optically combine a plurality of laser beams in a single optical fiber, and output a high-power laser beam by inputting the plurality of laser beams into the single optical fiber. For example, such laser apparatuses are disclosed in Japanese Unexamined Patent Publication Nos. 2003-347647 and 2004-045667. The disclosed laser apparatuses are basically constituted by one or more semiconductor lasers which emit a plurality of laser beams, a single optical fiber, and an optical condensing system which condenses the plurality of laser beams and makes the condensed laser beams enter the optical fiber.

In addition, in another known type of laser apparatus, a laser beam emitted from a single semiconductor laser is condensed by an optical condensing system, and is then coupled to an optical fiber. For example, such a laser apparatus is disclosed in European Patent Publication No. 0631164.

In many of the above types of laser apparatuses, the optical condensing systems and the semiconductor lasers are hermetically sealed in a package for prevention of contamination with dust and the like. In the case where such a package is used, usually, optical components constituting the optical condensing system (such as a condensing lens) are fixed to holders or other fixing members directly or indirectly fixed to the package, by using an adhesive, solder, or the like. In addition, the optical fiber is fixed to the package in such a manner that a light-entrance end of the optical fiber faces the optical condensing system. In many cases, an adhesive or solder is used for fixing the optical fiber. Further, Japanese Unexamined Patent Publication No. 2004-045667 discloses an example of a structure for fixing an optical fiber to a package with an adhesive.

However, in the case where semiconductor lasers and optical components are fixed to a package or fixing members fixed to the package as mentioned above, with an adhesive or solder, the output levels or the lifetimes of the semiconductor lasers deteriorate, and the error of the position of the condensing lens or the like increases to approximately several micrometers, although the condensing lens or the like are required to be precisely aligned with the optical fiber, and the precision of the position of the condensing lens or the like is inherently required to be as high as approximately one micrometer.

SUMMARY OF THE INVENTION

The present invention has been developed in view of the above circumstances.

The first object of the present invention is to provide a laser apparatus which can fix optical components constituting an optical condensing system with high position precision, and maintain the output levels and the lifetimes of semiconductor lasers at high levels.

The second object of the present invention is to provide a method for assembling the above laser apparatus.

In order to accomplish the above first object, in the laser apparatus according to the present invention, an adhesive and solder are properly used for fixing semiconductor lasers and optical components.

Specifically, according to the first aspect of the present invention, there is provided a laser apparatus comprising: one or more semiconductor lasers which emit one or more laser beams; an optical fiber; an optical condensing system which is constituted by one or more optical components, condenses the one or more laser beams emitted from the one or more semiconductor lasers, and makes the one or more laser beams enter the optical fiber from a light-entrance end of the optical fiber; and a package which fixedly contains the optical condensing system and the one or more semiconductor lasers, and fixedly holds the optical fiber in such a manner that the light-entrance end faces the optical condensing system. In the laser apparatus, the one or more optical components are directly or indirectly fixed to the package with a first layer of adhesive, the one or more semiconductor lasers are directly or indirectly fixed to the package with solder, and the first layer of adhesive has a thickness of less than or equal to 1 micrometer, and preferably a thickness within a range of 0.2 micrometers to 1 micrometer after the first layer of adhesive is dried. Hereinafter, a layer of adhesive which has a thickness of less than or equal to 1 micrometer, and preferably a thickness within a range of 0.2 micrometers to 1 micrometer after the layer of adhesive is dried is referred to as a thin layer of adhesive.

Preferably, the laser apparatus according to the first aspect of the present invention may also have one or any possible combination of the following additional features (i) to (viii).

(i) At least part of the one or more optical components and the one or more semiconductor lasers may be fixed to the package through fixing members which are fixed to the package.

(ii) In the laser apparatus according to the first aspect of the present invention having the feature (i), the fixing members may be fixed to the package with solder.

(iii) The laser apparatus according to the first aspect of the present invention having the feature (i) may further comprise one or more holders which are fixed with a second layer of adhesive to one or more fixing members fixed to the package, where the one or more optical components constituting the optical condensing system are fixed to the one or more holders with a third layer of adhesive, and each of the second and third layers of adhesive has a thickness of less than or equal to 1 micrometer, and preferably a thickness within a range of 0.2 micrometers to 1 micrometer after each of the second and third layers of adhesive is dried.

(iv) A plurality of elements including the one or more semiconductor lasers may be directly or indirectly fixed to the package with an identical type of solder having an identical melting temperature.

(v) In the laser apparatus according to the first aspect of the present invention having the feature (i), a plurality of elements including the one or more semiconductor lasers may be fixed with an identical type of solder having an identical melting temperature to the package or one or more fixing members fixed to the package.

(vi) A plurality of elements including the one or more semiconductor lasers may be directly or indirectly fixed to the package with different types of solder having different melting temperatures, respectively.

(vii) In the laser apparatus according to the first aspect of the present invention having the feature (i), a plurality of elements including the one or more semiconductor lasers may be fixed to the package or one or more fixing members which are fixed to the package, with different types of solder having different melting temperatures, respectively.

(viii) In the laser apparatus according to the first aspect of the present invention having the feature (vi) or (vii), the different types of solder may include at least two of Sn48-In52 solder having a melting temperature of 117° C., Sn-3.5Ag-0.5Cu solder having a melting temperature of 220° C., and Sn—Au solder having a melting temperature of 280° C.

In order to accomplish the above second object, the second aspect of the present invention is provided. According to the second aspect of the present invention, there is provided a method for assembling the laser apparatus according to the first aspect of the present invention. The method comprises the steps of: (a) fixing first elements which include the one or more semiconductor lasers and are to be fixed with solder; and (b) fixing second elements which include the one or more optical components and are to be fixed with a second layer of adhesive, after the first elements are fixed, where the second layer of adhesive has a thickness of less than or equal to 1 micrometer, and preferably a thickness within a range of 0.2 micrometers to 1 micrometer after the second layer of adhesive is dried.

Preferably, the method according to the second aspect of the present invention may also have one or any possible combination of the aforementioned additional features (i) and (ii) and the following additional features (ix) to (xi).

(ix) The laser apparatus according to the first aspect of the present invention having the feature (i) may further comprise one or more holders which are fixed with a third layer of adhesive to one or more fixing members fixed to the package, where the one or more optical components constituting the optical condensing system are fixed to the one or more holders with a fourth layer of adhesive, and each of the third and fourth layers of adhesive has a thickness of less than or equal to 1 micrometer, and preferably a thickness within a range of 0.2 micrometers to 1 micrometer after each of the third and fourth layers of adhesive is dried.

(x) In step (a), one or more first fixing operations are performed by using one or more first types of solder having one or more first melting temperatures, and thereafter one or more second fixing operations are performed by using one or more second types of solder having one or more second melting temperatures which are lower than the one or more first melting temperatures, and melting the one or more second types of solder at one or more temperatures lower than the one or more first melting temperatures.

(xi) The one or more first types of solder may include Sn-3.5Ag-0.5Cu solder having a melting temperature of 220° C. and Sn—Au solder having a melting temperature of 280° C., and the one or more second types of solder include Sn48-In52 solder having a melting temperature of 117° C.

The first and second aspects of the present invention have the following advantages.

(1) According to research by the present inventors, it is found that deterioration of the output levels and the lifetimes of the semiconductor lasers occurs in the case where semiconductor lasers are directly or indirectly fixed to a package with an adhesive. Usually, organic adhesives such as ultraviolet-curable type adhesives are used in such cases. However, the thermal conductivities of the organic adhesives such as ultraviolet-curable type adhesives are lower than the thermal conductivities of the solder, so that the performance of heat dissipation from the semiconductor lasers to the package is impaired by the existence of the adhesive. Therefore, the temperature at which the semiconductor lasers are driven becomes high, and the output levels or the lifetimes of the semiconductor lasers deteriorate.

In many cases, semiconductor lasers are not directly fixed to the package, and are instead fixed to one or more fixing members which are fixed to the package and made of a material exhibiting high thermal conductivity such as copper. Even in such cases, when the semiconductor lasers are fixed to the one or more fixing members with an adhesive, the performance of the heat dissipation from the semiconductor lasers to the package is impaired by the existence of the layer of the adhesive.

In view of the above findings, the laser apparatus according to the first aspect of the present invention is provided. In the laser apparatus according to the first aspect of the present invention, the one or more semiconductor lasers are fixed with solder to the package or the one or more fixing members which are fixed to the package. Since the solder has higher thermal conductivity than the adhesives, the heat generated by the semiconductor lasers can be satisfactorily dissipated through the solder to the package or to the one or more fixing members which are fixed to the package. Therefore, it is possible to prevent the rise of the temperature at which the semiconductor lasers are driven and deterioration of the output levels or the lifetimes of the semiconductor lasers.

In addition, according to research by the present inventors, it is found that the precision of the positions of the optical components constituting the optical condensing system in the conventional laser apparatuses is lowered in the case where the optical components are fixed with solder to the package or the one or more fixing members which are fixed to the package. Specifically, in such laser apparatuses, the optical components are fixed by depositing solder between the optical components and the package or the one or more fixing members which are fixed to the package, melting the solder by heat, and solidifying the solder. However, the optical components slightly move when the solder is melted.

In view of the above findings, in the laser apparatus according to the first aspect of the present invention, the one or more optical components constituting the optical condensing system are fixed to the package or the one or more fixing members which are fixed to the package, with a thin layer of adhesive (i.e., a layer of adhesive which has a thickness of less than or equal to 1 micrometer, and preferably a thickness within a range of 0.2 micrometers to 1 micrometer after the thin layer of adhesive is dried). Therefore, the optical components in the laser apparatus according to the first aspect of the present invention do not move as the optical components in the conventional laser apparatus which are fixed to the package or the fixing members with solder, so that the precision of the positions of the optical components constituting the optical condensing system in the laser apparatus according to the first aspect of the present invention can be maintained at a high level.

(2) In particular, in the case where one or more fixing members to which the one or more semiconductor lasers are fixed are also fixed to the package with solder, heat can be satisfactorily dissipated from the one or more fixing members to the package, and therefore the effect of preventing the deterioration of the output levels and the lifetimes is further enhanced.

On the other hand, in the case where one or more fixing members to which optical components constituting an optical condensing system are fixed are fixed to the package with solder, the precision of the positions of the one or more fixing members with respect to the package is likely to be lower than the precision of the positions of one or more fixing members fixed to the package with an adhesive. However, when the optical components constituting the optical condensing system are fixed to the one or more fixing members with an adhesive in such a manner that the optical components are precisely aligned with the optical fiber, the low precision of the positions of the one or more fixing members to which the optical components are fixed causes no problem.

(3) In the case where one or more holders are fixed to one or more fixing members which are fixed to the package, and one or more optical components constituting the optical condensing system are fixed to the one or more holders in the laser apparatus according to the first aspect of the present invention, it is possible to adjust the positions of the one or more holders by moving the one or more holders along the one or more fixing members, and adjust the positions of the one or more optical components by moving the one or more optical components along the one or more holders. Therefore, the operations for adjusting the positions of the optical components become easy. In addition, when the one or more holders and the one or more optical components are fixed with a thin layer of adhesive, the precision in the position adjustment of the optical components is improved.

(4) In the case where a plurality of elements including the one or more semiconductor lasers are directly or indirectly fixed to the package with an identical type of solder having an identical melting temperature, procurement and management of the solder are simplified, so that the cost of the laser apparatus can be reduced.

However, in this case, the melting temperature of the solder used for fixing each of the plurality of elements is identical. Therefore, if the entire package is heated in order to melt solder used for fixing a first one of the plurality of elements, solder with which a second one of the plurality of elements is already fixed may also be melted, so that the second one of the plurality of elements may move or come off. Thus, it is necessary to locally heat each region in which solder is to be melted, and take measures to prevent heat transfer to solder with which one or more elements are already fixed.

On the other hand, in the case where a plurality of elements including the one or more semiconductor lasers are directly or indirectly fixed to the package with different types of solder having respectively different melting temperatures, it is possible to simplify the heating operation by executing the method according to the second aspect of the present invention having the aforementioned feature (x), which is explained later.

(5) In the method for assembling the laser apparatus according to the second aspect of the present invention, elements which include the one or more optical components and are to be fixed with a thin layer of adhesive are fixed after other elements which include the one or more semiconductor lasers and are to be fixed with solder are fixed. Therefore, even when the precision of the positions of the elements which include the one or more semiconductor lasers and are fixed with solder is low, it is possible to finally achieve high precision in the positions of the optical components and the like with respect to the optical fiber since the optical components and the like can be fixed with high position precision by using a thin layer of adhesive (i.e., a layer of adhesive which has a thickness of less than or equal to 1 micrometer, and preferably a thickness within a range of 0.2 micrometers to 1 micrometer after the layer of adhesive is dried) after the elements including the one or more semiconductor lasers are fixed with the solder.

(6) In the case where one or more first fixing operations are performed by using one or more first types of solder having one or more first melting temperatures, and thereafter one or more second fixing operations are performed by using one or more second types of solder having one or more second melting temperatures which are lower than the one or more first melting temperatures, and melting the one or more second types of solder at one or more temperatures lower than the one or more first melting temperatures, the one or more first types of solder used in the one or more first fixing operations are not melted even when the heat generated by the one or more second fixing operations is transferred to the one or more first types of solder used (and solidified) in the one or more first fixing operations. Therefore, it is possible to heat the entire package for melting the one or more second types of solder. That is, the heating operations are simplified.

DESCRIPTION OF PREFERRED EMBODIMENTS

Preferred embodiments of the present invention are explained in detail below with reference to drawings.

Construction of Laser Apparatus

Figure 1:
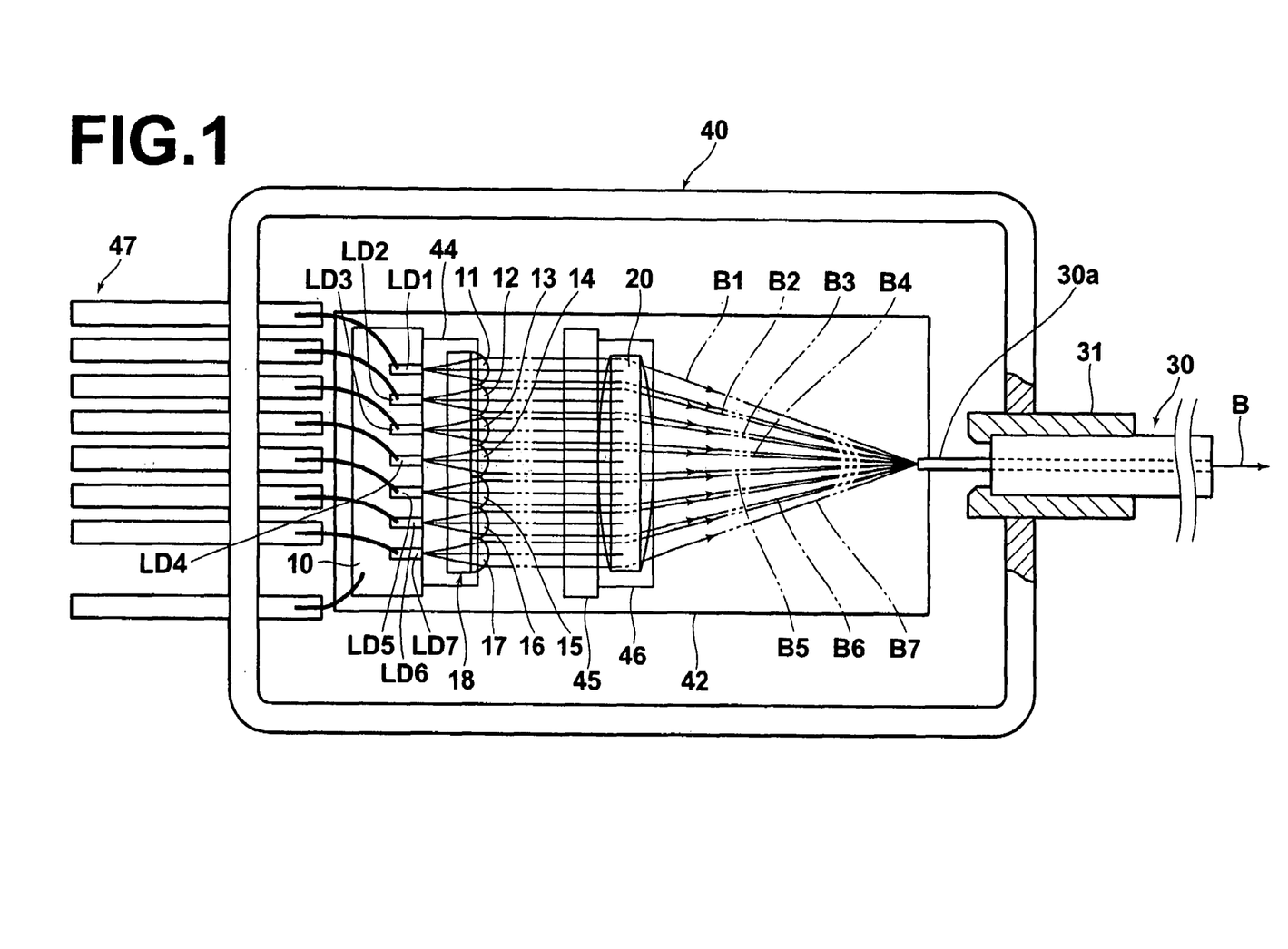
FIG. 1 is a plan view, partly in cross section, of a laser apparatus according to an embodiment of the present invention.
Figure 2:
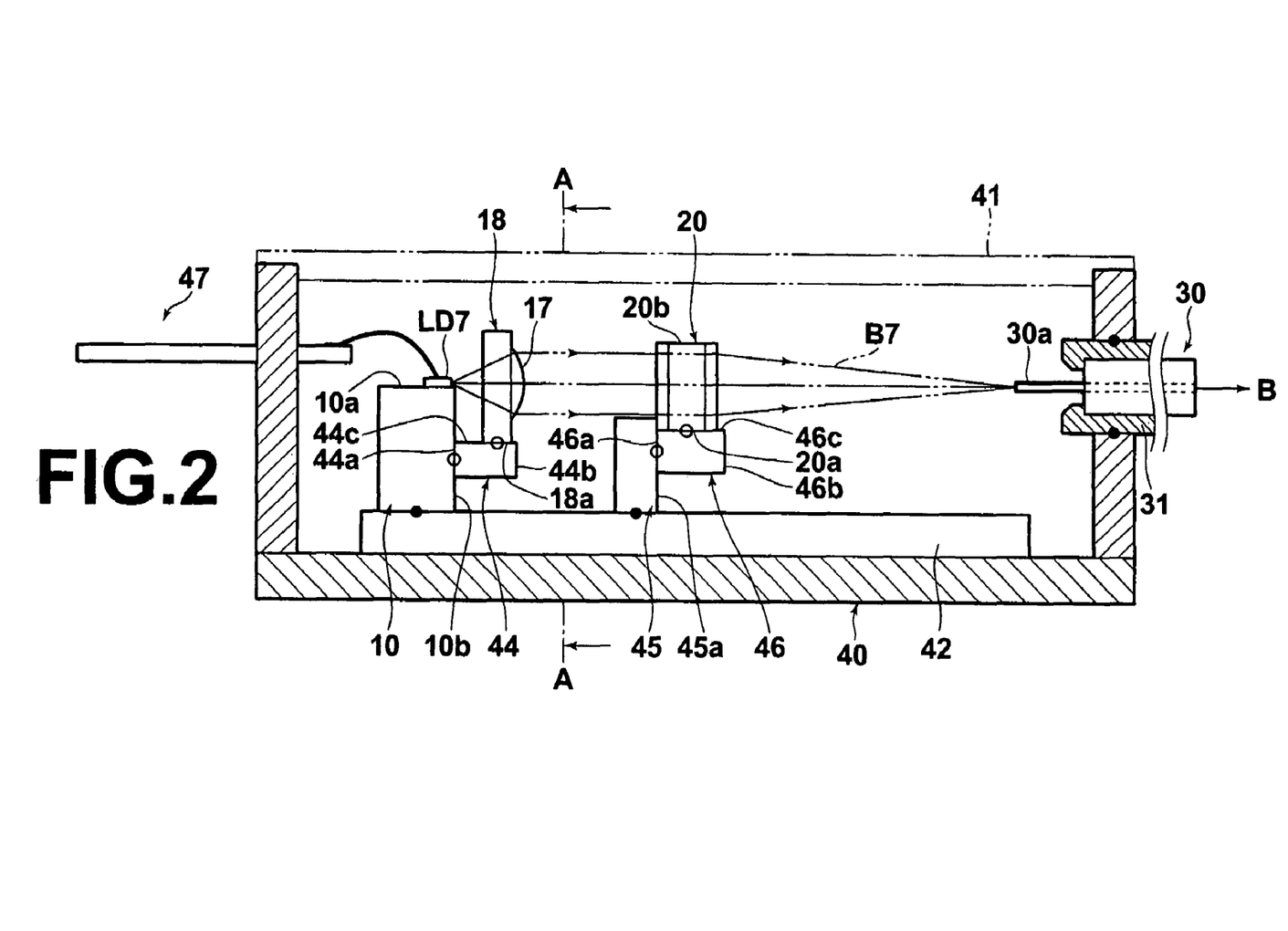
FIG. 2 is a side view, partly in cross section, of the laser apparatus according to the embodiment.
Figure 3:
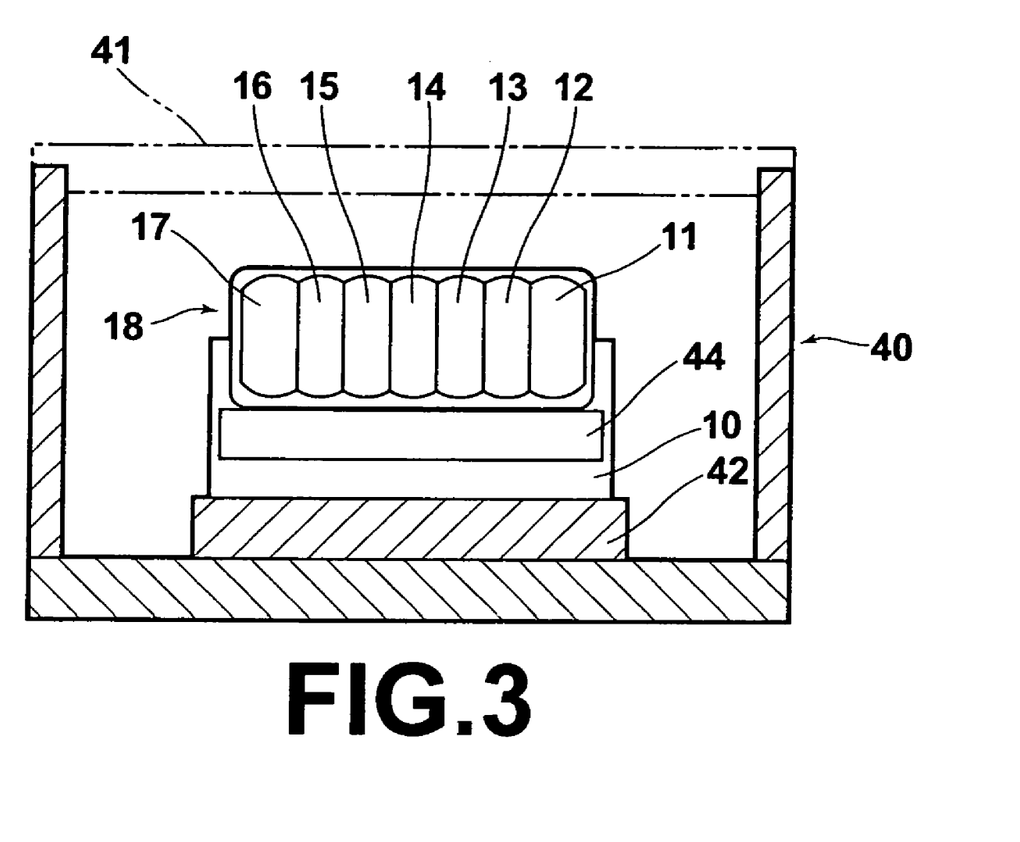
FIG. 3 is a front view of a rear half of the laser apparatus according to the embodiment which is cut at a cross section.

FIGS. 1 and 2 are respectively plan and side views, partly in cross section, of a laser apparatus according to an embodiment of the present invention, and FIG. 3 is a front view of a rear half of the laser apparatus which is cut at the cross section A-A indicated in FIG. 2. The laser apparatus according to the present embodiment is a high-luminosity combined-ultraviolet-light laser apparatus (which may be hereinafter referred to as a combined laser apparatus or a laser-light source).

As illustrated in FIGS. 1, 2, and 3, the laser apparatus according to the present embodiment comprises a plurality (e.g., seven) of GaN-based semiconductor laser chips LD1, LD2, LD3, LD4, LD5, LD6, and LD7, a collimator-lens array 18, a condensing lens 20, and a multimode optical fiber 30. The GaN-based semiconductor lasers LD1 through LD7 are arrayed on and fixed to a heat block 10, which has high thermal conductivity. In the collimator-lens array 18, a plurality of collimator lenses 11 through 17 respectively corresponding to the GaN-based semiconductor lasers LD1 through LD7 are integrally formed.

For example, all the GaN-based semiconductor lasers LD1 through LD7 have an oscillation wavelength of 405±5 nm and a maximum output power of 50 to 300 mW. The GaN-based semiconductor lasers LD1 through LD7 oscillate in multiple transverse modes. Alternatively, it is possible to use single-mode semiconductor lasers.

The laser beams B1 through B7 are emitted from the GaN-based semiconductor lasers LD1 through LD7 as divergent beams. Then, the divergent laser beams B1 through B7 are respectively collimated by the collimator lenses 11 through 17 in the collimator-lens array 18. FIG. 3 shows the collimator-lens array 18 viewed from the cross section A-A indicated in FIG. 2.

The collimated laser beams B1 through B7 are condensed by the condensing lens 20, and converge on an light-entrance end face of the core 30a of the multimode optical fiber 30. In this embodiment, the collimator lenses 11 through 17 and the condensing lens 20 constitute an optical condensing system, and the optical condensing system and the multimode optical fiber 30 constitute an optical combining system. That is, the laser beams B1 through B7 condensed by the condensing lens 20 enter the core 30a of the multimode optical fiber 30, propagate through the core 30a, and are optically combined into a single laser beam B, so that the laser beam B is outputted from the multimode optical fiber 30. The multimode optical fiber 30 may be a step-index type, a graded-index type, or a composite-type optical fiber. In the composite-type optical fiber, the functions of the step-index type optical fiber and the graded-index type optical fiber are combined.

The optical components constituting the laser apparatus according to the present embodiment are contained in a box type package 40. The package 40 has an opening on its upper side, and is provided with a cover 41, so that the opening of the package 40 can be closed with the cover 41. Thus, when the opening of the package 40 is closed with the cover 41, the optical components are held in a closed and hermetically sealed space enclosed by the package 40 and the cover 41. A near-end portion of the multimode optical fiber 30 on the light-entrance side is held in a ferrule 31, and fixed to a sidewall of the package 40.

A base plate 42 is fixed on the bottom surface of the package 40, the aforementioned heat block 10 is attached on the upper surface of the base plate 42, the GaN-based semiconductor lasers LD1 through LD7 are fixed on an upper face 10a of the heat block 10, and a collimator-lens holder 44 for holding the collimator-lens array 18 is fixed on a front face 10b of the heat block 10. In addition, a mount 45 for fixing a lens is fixed on the upper surface of the base plate 42, and a condensing-lens holder 46 for holding the condensing lens 20 is fixed on a front face 45a of the mount 45. Further, wirings 47 for supplying driving currents to the GaN-based semiconductor lasers LD1 through LD7 are led out of the package 40 through an opening formed in a sidewall of the package 40.

As illustrated in FIG. 3, each of the collimator lenses 11 through 17 in the collimator-lens array 18 has a shape obtained by cutting out an elongated portion of an aspherical round lens so that the portion contains the optical axis of the aspherical round lens. For example, the collimator-lens array 18 can be formed by molding from optical glass. The collimator lenses 11 through 17 have a first aperture diameter in a first direction and a second aperture diameter in a second direction perpendicular to the first direction, and the second aperture diameter is greater than the first aperture diameter, where the light-emission points of the GaN-based semiconductor lasers LD1 through LD7 are arrayed along the first direction (i.e., the horizontal direction in FIG. 3), and the second direction corresponds to the vertical direction in FIG. 3. Thus, the collimator lenses 11 through 17 are closely arranged in the direction along which the light-emission points of the GaN-based semiconductor lasers LD1 through LD7 are arrayed.

Each of the GaN-based semiconductor lasers LD1 to LD7 has an emission width of 2 micrometers. For example, the spread angle of each of laser beams B1 through B7 emitted from the GaN-based semiconductor lasers LD1 to LD7 is 10 degrees in the direction parallel to the active layer and 30 degrees in the direction perpendicular to the active layer. The light-emission points of the GaN-based semiconductor lasers LD1 to LD7 are arranged along a line parallel to the active layers of the GaN-based semiconductor lasers LD1 to LD7.

Therefore, the laser beams B1 through B7 emitted from the GaN-based semiconductor lasers LD1 to LD7 enter the collimator lenses 11 through 17 in such a manner that the direction of the greater spread angle of each of the laser beam B1 through B7 coincides with the direction of the greater aperture diameter of each of the collimator lenses 11 through 17, and the direction of the smaller spread angle of each of the laser beam B1 through B7 coincides with the direction of the smaller aperture diameter of each of the collimator lenses 11 through 17. That is, the elongated shapes of the collimator lenses 11 through 17 correspond to the elliptical cross-sectional shapes of the laser beams B1 through B7 which enter the collimator lenses 11 through 17, so that the noneffective portions of the collimator lenses 11 through 17 are minimized. In this example, the effective aperture diameter of each of the collimator lenses 11 through 17 is 1.1 mm in the horizontal direction, and 3.6 mm in the vertical directions, and the beam diameter of each of the laser beam B1 through B7 is 0.9 mm in the horizontal direction and 2.6 mm in the vertical direction. In addition, each of the collimator lenses 11 through 17 has a focal length (f1) of 3 mm and a numerical aperture (NA) of 0.6, and the collimator lenses 11 through 17 are arranged with a pitch of 1.2 mm.

The condensing lens 20 has a shape which is obtained by cutting an aspherical round lens so as to leave an elongated portion containing the optical axis of the aspherical round lens. Thus, the condensing lens 20 is elongated in the horizontal direction (along which the collimator lenses 11 through 17 are arranged, and has a small dimension in the vertical direction (perpendicular to the direction along which the collimator lenses 11 through 17 are arranged). The condensing lens 20 has a focal length (f2) of 23.15 mm and a magnification power of 7.7. The condensing lens 20 and the aforementioned collimator-lens array 18 can be formed by molding from optical glass or synthetic resin.

For example, the multimode optical fiber 30 is a step-index type optical fiber having a core diameter of 60 micrometers and a numerical aperture (NA) of 0.23. In addition, the transmittance of the end face coating is 99.5%, and the internal loss is 98.5%.

In this example, the coupling efficiency of the collimated laser beams B1 through B7 to the multimode optical fiber 30 is 0.9. Therefore, when the GaN-based semiconductor lasers LD1 through LD7 each have an output power of 50 to 300 mW, the optically-combined laser beam B has an output power of 0.315 to 1.89 W (=50 to 300 mW×0.9×7).

Assembly of Laser Apparatus

Hereinbelow, methods and structures for fixing constituents of the laser apparatus according to the present embodiment are explained in detail. In the following explanations, the constituents of the laser apparatus are fixed with either solder or an organic adhesive. In FIG. 2, each portion of the laser apparatus in which surfaces of constituents are bonded to each other with solder is indicated by a black circle, and each portion of the laser apparatus in which surfaces of constituents are bonded to each other with an organic adhesive is indicated by a blank circle. As explained later, in order to fix surfaces of two constituents to each other with an organic adhesive, the surfaces are brought into close contact, and the two constituents are spot-bonded to each other with the organic adhesive, so that a thin film of the organic adhesive having a thickness of less than or equal to 1 micrometer, and preferably a thickness within a range of 0.2 micrometers to 1 micrometer is formed between the surfaces when the organic adhesive is dried.

First, the operations for fixing the GaN-based semiconductor lasers LD1 through LD7 are explained below.

The GaN-based semiconductor lasers LD1 through LD7 are mounted on the upper face 10a of the heat block 10 by using first Sn—Au solder having a melting temperature of 280° C. The heat block 10 is made of AlN (aluminum nitride) and has a rectangular parallelepiped shape, where AlN is superior in thermal conductivity and polishing workability. In the operation of mounting the GaN-based semiconductor lasers LD1 through LD7, the GaN-based semiconductor lasers LD1 through LD7 are first tacked to the upper face 10a of the heat block 10 one by one with second Sn—Au solder, where the melting temperature of the second Sn—Au solder is adjusted to a first temperature which is lower than the melting temperature (280° C.) of the first Sn—Au solder. After all the GaN-based semiconductor lasers LD1 through LD7 are tacked to the heat block 10, the assembly is heated in a reflow furnace to a second temperature which is higher than the melting temperature (280° C.) of the first Sn—Au solder so that the first Sn—Au solder is melted. Thus, the GaN-based semiconductor lasers LD1 through LD7 are fixed. For example, the first and second temperatures are set to 150° C. and 330° C., respectively.

When the GaN-based semiconductor lasers LD1 through LD7 are fixed as above, the temperature of the first Sn—Au solder deposited on the areas on which semiconductor lasers are not yet mounted does not exceed its melting temperature. Therefore, it is possible to prevent oxidation of the first Sn—Au solder, and realize stable mounting with high precision (e.g., approximately ±0.1 micrometers).

The GaN-based semiconductor laser chips LD1 through LD7 may be directly fixed to the heat block 10. Alternatively, it is possible to fix each of the GaN-based semiconductor laser chips LD1 through LD7 to a separate submount with solder, and then fix the submount to the heat block 10 in a similar manner to the aforementioned manner in which the GaN-based semiconductor laser chips LD1 through LD7 are directly fixed to the heat block 10.

The ferrule 31 holding the near-end portion of the multimode optical fiber 30 on the light-entrance side is fixed to the sidewall of the package 40, for example, by using Sn-3.5Ag-0.5Cu solder, which has the melting temperature of 220° C. Specifically, two C-shaped rings made of the Sn-3.5Ag-0.5Cu solder (obtained by equally dividing a cylinder made of the Sn-3.5Ag-0.5Cu solder) is inserted between the outer surface of the ferrule 31 and an inner surface of a cylindrical hole formed through the sidewall of the package 40, and the two C-shaped rings are locally heated so that the Sn-3.5Ag-0.5Cu solder melts and hermetically closes the gap between the outer surface of the ferrule 31 and the inner surface of the cylindrical hole. At this time, the multimode optical fiber 30 is fixed so that the core axis of the multimode optical fiber 30 is perpendicular to the front face 10b of the heat block 10 with high accuracy. When the Sn-3.5Ag-0.5Cu solder is heated in a low-oxygen atmosphere produced by blowing $N_2$ assist gas onto the Sn-3.5Ag-0.5Cu solder, It is possible to prevent oxidation of the Sn-3.5Ag-0.5Cu solder caused by the local heating.

Thereafter, the heat block 10, on which the GaN-based semiconductor lasers LD1 through LD7 are mounted, is fixed on the base plate 42. The bottom face of the heat block 10 is metalized by evaporation of gold, and fixed on the upper surface of the base plate 42 with, for example, Sn48-In52 solder, which has the melting temperature of 117° C. The base plate 42 is formed of, for example, CuW, CuMo, or Kovar, plated with gold, and fixed to the bottom surface of the package 40.

The heat block 10 is fixed in such a manner that the front face 10b of the heat block 10 is precisely perpendicular to the base plate 42. The front face 10b is mirror finished, and used as a mounting surface (on which the collimator-lens holder 44 is to be fixed) and as a reference surface (explained later).

In the operations of fixing the heat block 10 to the base plate 42, the Sn48-In52 solder is melted by heating the Sn48-In52 solder to the temperature of 150° C., which is higher than the melting temperature (117° C.) of the Sn48-In52 solder by a certain amount and lower than the melting temperature (220° C.) of the Sn-3.5Ag-0.5Cu solder and the melting temperature (280° C.) of the aforementioned first Sn—Au solder. Therefore, the first Sn—Au solder with which the GaN-based semiconductor lasers LD1 through LD7 are fixed and the Sn-3.5Ag-0.5Cu solder with which the ferrule 31 is fixed are not melted, so that the fixed positions of the GaN-based semiconductor lasers LD1 through LD7 and the ferrule 31 are securely maintained.

Hereinbelow, methods and structures for fixing the collimator-lens array 18 and the condensing lens 20 are explained in detail.

In the above laser apparatus, in order to ensure high coupling efficiency of the collimated laser beams B1 through B7 to the multimode optical fiber 30, it is necessary to fix the collimator-lens array 18 and the condensing lens 20 in such a manner that the optical axes of the collimator-lens array 18 and the condensing lens 20 are precisely parallel to the core axis of the multimode optical fiber 30 at the light-entrance end of the multimode optical fiber 30.

First, a method and a structure for fixing the collimator-lens array 18 by using the collimator-lens holder 44 and the like are explained below.

Figure 4:
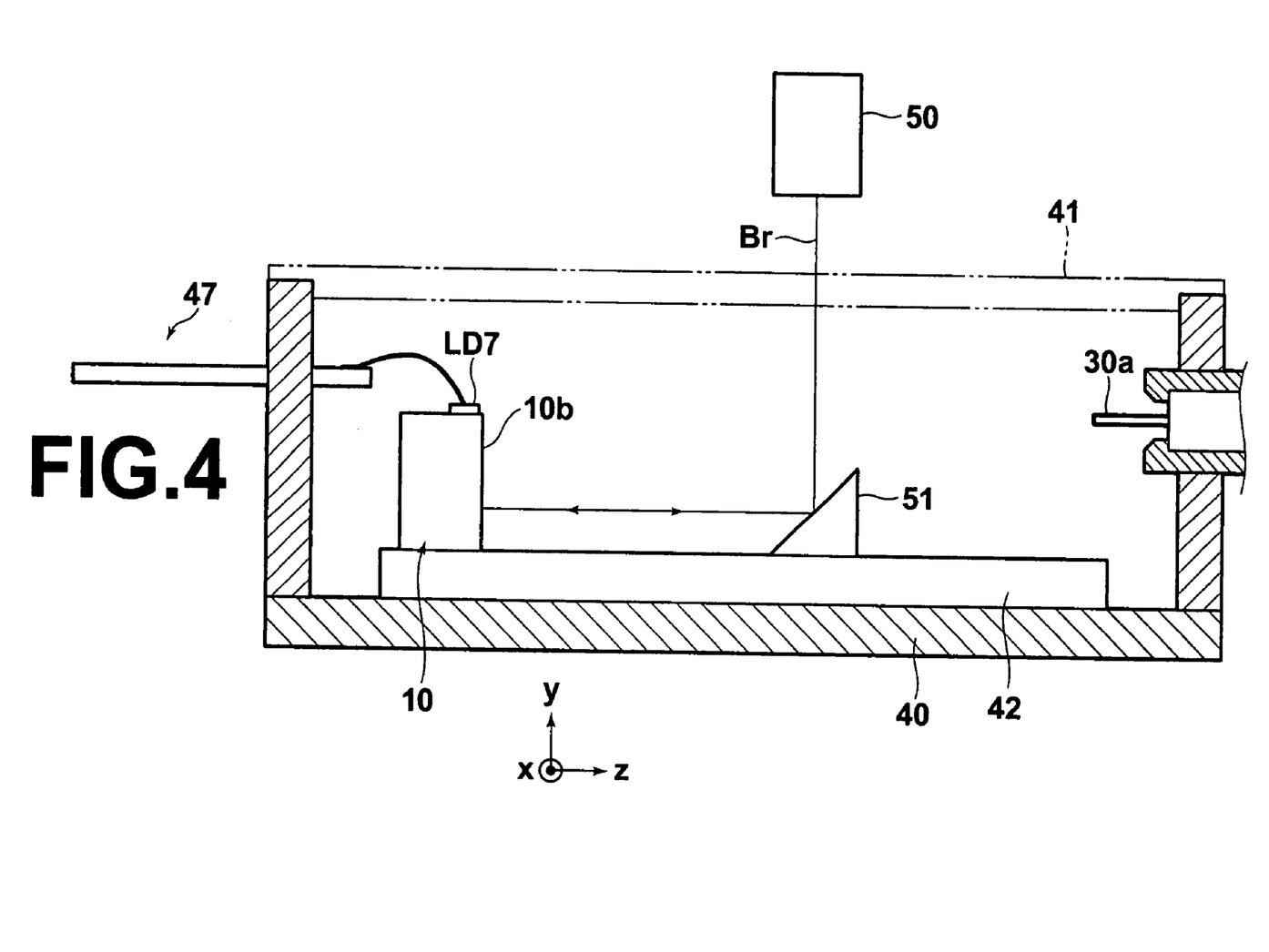
FIG. 4 is a first diagram for explaining a method for assembling the laser apparatus.

Before adhesively fixing the collimator-lens holder 44, the angle between the front face 10b (as the mounting surface and the reference surface of the heat block 10) and a reference direction is measured by using the laser autocollimator 50 and the mirror 51 as illustrated in FIG. 4, where the mirror 51 is placed on the base plate 42. According to the present embodiment, the propagation direction of a laser beam Br emitted from the laser autocollimator 50 is changed by 90 degrees by reflection by the mirror 51 so that the laser beam Br is perpendicularly incident on the front face 10b of the heat block 10. In this example, the propagation direction z of the laser beam Br after the reflection by the mirror 51 is the reference direction.

The laser autocollimator 50 receives the laser beam Br which is reflected at the front face 10b and is again reflected by the mirror 51 toward the laser autocollimator 50, and measures the angle which the front face 10b makes with the reference direction. This angle is determined by inclination angles $\theta x$ and $\theta y$ around the x- and y-axes, which are perpendicular to the reference direction z and to each other. In the example of FIG. 4, the y direction is identical to the propagation direction of the laser beam Br emitted from the laser autocollimator 50. For example, when the front face 10b of the heat block 10 is precisely perpendicular to the reference direction z, both the inclination angles θx and θy are zero. The measured inclination angles θx and θy are recorded on a recording sheet or the like, or stored in a storage.

Figure 5:
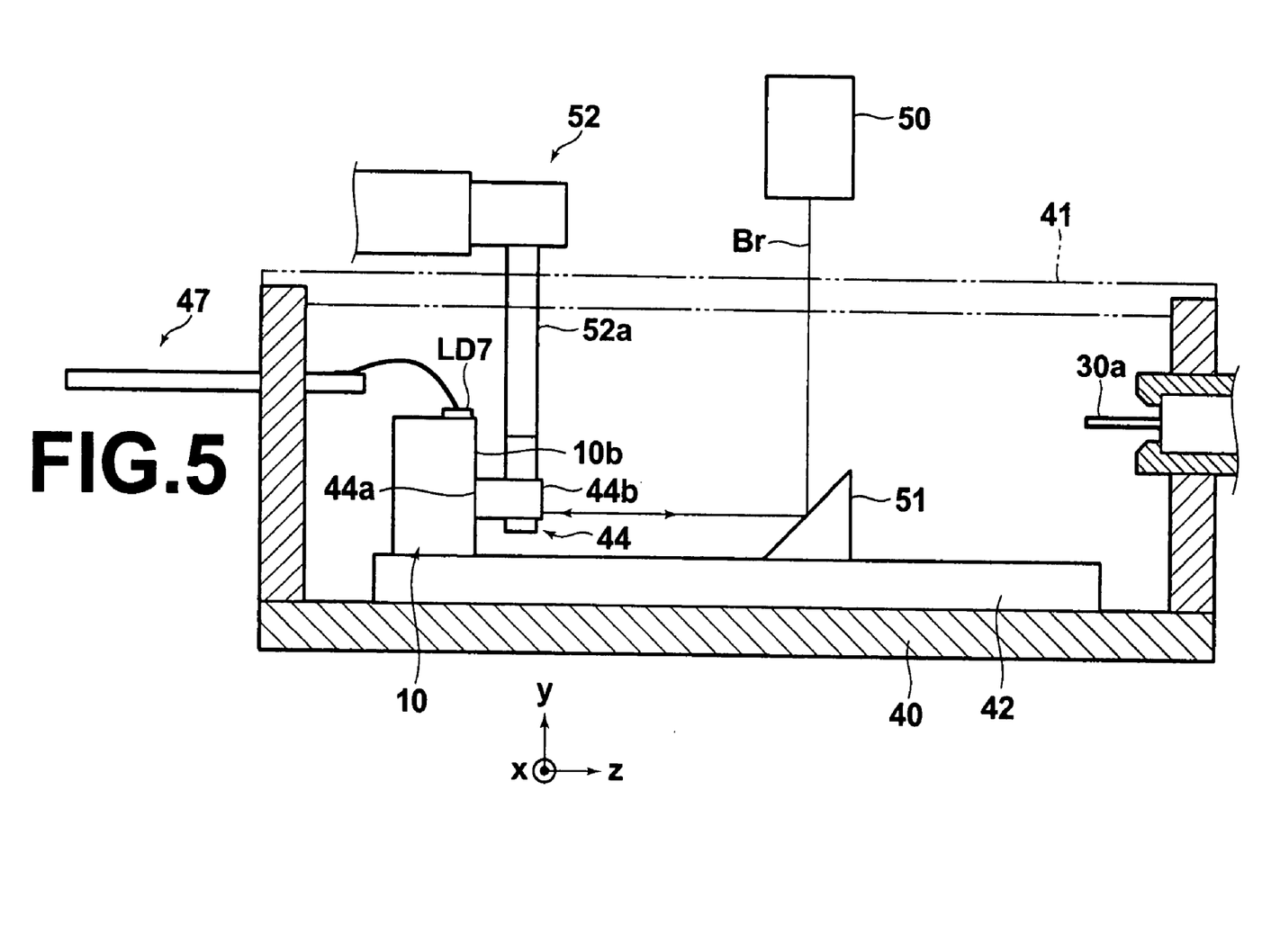
FIG. 5 is a second diagram for explaining the method for assembling the laser apparatus.

Next, the collimator-lens holder 44 is held by using a mechanical hand 52 (having a holding portion 52a which holds the collimator-lens holder 44) in a position in which a rear face 44a (as an adhesion surface) of the collimator-lens holder 44 lightly touches the front face 10b of the heat block 10 as illustrated in FIG. 5. For example, the mechanical hand 52 is a six-axis type, which has six-axis freedom in parallel translation in the directions of three axes and rotations on the three axes. It is possible to maintain the force which makes the collimator-lens holder 44 touch the front face 10b, at a predetermined level, for example, by using a load cell or the like, which is built in the mechanical hand 52.

In addition, while the collimator-lens holder 44 is held as above, the angle which a front face 44b (as a reference surface) of the collimator-lens holder 44 makes with the reference direction z is continuously measured in a similar manner to the aforementioned measurement of the angle between the front face 10b and the reference direction z. The angle between the front face 44b and the reference direction z is also determined by the inclination angles θx and θy.

In the operation of holding the collimator-lens holder 44, the mechanical hand 52 is controlled so that the continuously measured inclination angles θx and θy of the front face 44b respectively coincide with the inclination angles θx and θy of the front face 10b, and the collimator-lens holder 44 is located at a predetermined position in each of the x- and y-directions. When the collimator-lens holder 44 reaches the desired position, the movement of the mechanical hand 52 is stopped, and spots of adhesive are deposited in the gap between the front face 10b of the heat block 10 and the rear face 44a of the collimator-lens holder 44. Thus, when the spots of adhesive are cured, the collimator-lens holder 44 is adhesively fixed to the front face 10b.

In order to place the collimator-lens holder 44 at the predetermined position in each of the x- and y-directions, it is possible to determine the position of the collimator-lens holder 44 in each of the x- and y-directions by making the rear face 44a of the collimator-lens holder 44 slide on the front face 10b of the heat block 10. Therefore, the operation of placing the collimator-lens holder 44 at the predetermined position in each of the x- and y-directions is not difficult.

The collimator-lens holder 44 is formed so that the rear face 44a and the front face 44b are parallel with the high precision of approximately ±15". Such high precision in the parallelism between the rear face 44a and the front face 44b can be readily realized by polishing these faces. In this case, when the inclination angles θx and θy of the front face 44b of the collimator-lens holder 44 respectively coincide with the inclination angles θx and θy of the front face 10b of the heat block 10, the rear face 44a of the collimator-lens holder 44 is parallel with the front face 10b. Therefore, when the collimator-lens holder 44 is adhesively fixed to the front face 10b while maintaining the position in which the inclination angles θx and θy of the front face 44b of the collimator-lens holder 44 respectively coincide with the inclination angles θx and θy of the front face 10b of the heat block 10, the rear face 44a of the fixed collimator-lens holder 44 becomes precisely parallel with the front face 10b of the heat block 10.

In addition, in the above operation for adhesively fixing the collimator-lens holder 44, the mechanical hand 52 is further controlled on the basis of the outer dimensions of the collimator-lens holder 44 so that the collimator-lens holder 44 reaches a predetermined angular position around the z-axis in which an upper face 44c of the collimator-lens holder 44 becomes parallel with the base plate 42. Thus, the upper face 44c of the fixed collimator-lens holder 44 becomes precisely parallel with the base plate 42. The outer dimensions of the collimator-lens holder 44 are precisely measured in advance.

The adhesive used in the above adhesively fixing is, for example, an ultraviolet-curable type organic adhesive. However, since the collimator-lens holder 44 is formed of glass which transmits ultraviolet light, the ultraviolet light for curing the adhesive can transmit through the collimator-lens holder 44, so that the adhesive can be sufficiently irradiated with the ultraviolet light.

Figure 6:
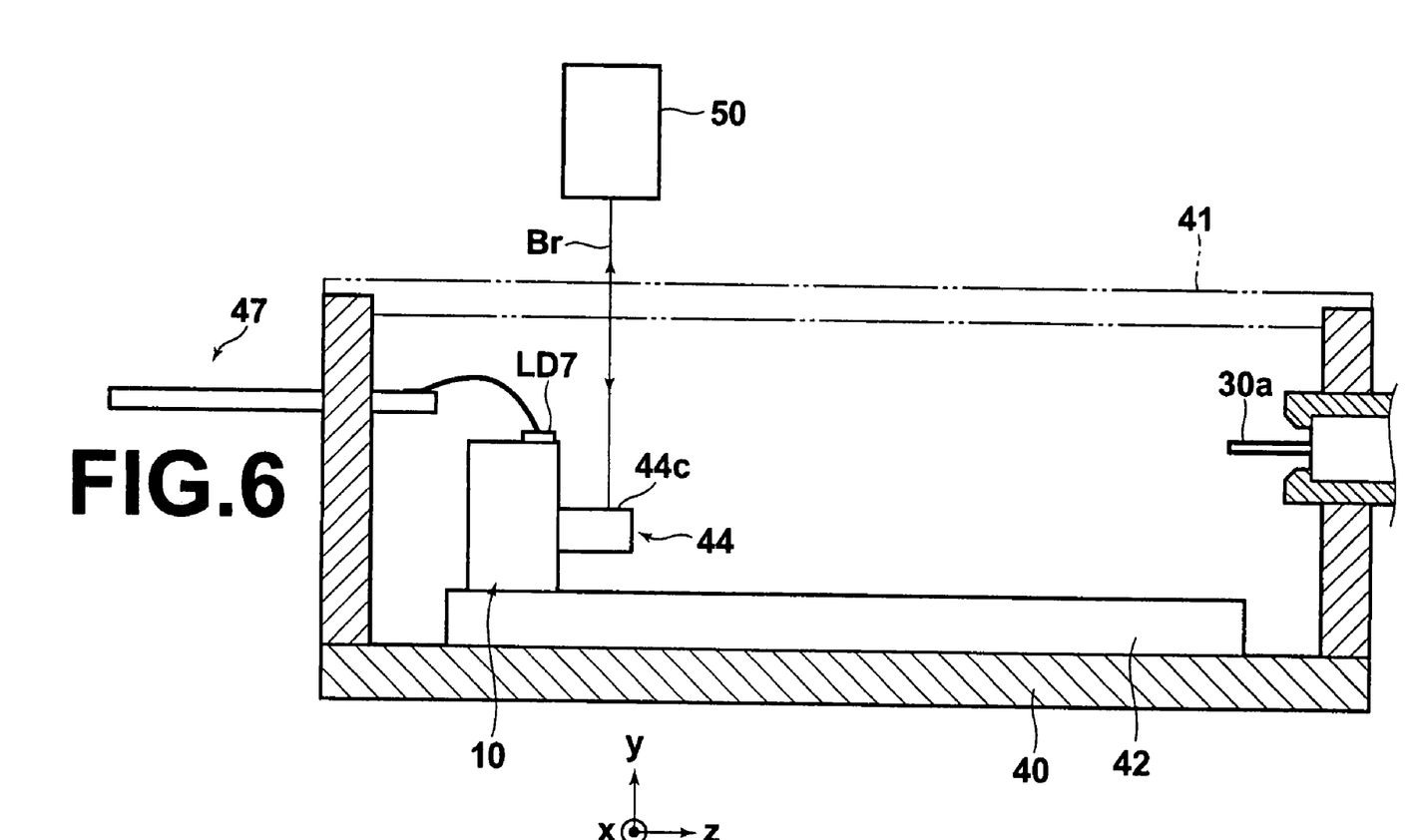
FIG. 6 is a third diagram for explaining the method for assembling the laser apparatus.

Thereafter, the mechanical hand 52 is controlled so that the holding portion 52a is removed from the package 40. Then, the angle which an upper face 44c of the fixed collimator-lens holder 44 makes with a reference direction y is measured by using the laser autocollimator 50 as illustrated in FIG. 6. In this measurement, the reference direction y is the propagation direction of the laser beam Br emitted downward from the laser autocollimator 50 as illustrated in FIG. 6, which is identical to the propagation direction of the laser beam Br emitted downward from the laser autocollimator 50 in the operations illustrated in FIGS. 4 and 5. At this time, the angle which the upper face 44c of the collimator-lens holder 44 makes with the reference direction y is determined by the inclination angles $\phi x$ and $\phi z$ around the x- and z-axes. For example, when the upper face 44c of the collimator-lens holder 44 is precisely perpendicular to the reference direction y, the inclination angles $\phi x$ and $\phi z$ are zero. The measured inclination angles $\phi x$ and $\phi z$ are recorded on a recording sheet or the like, or stored in a storage.

Figure 7:
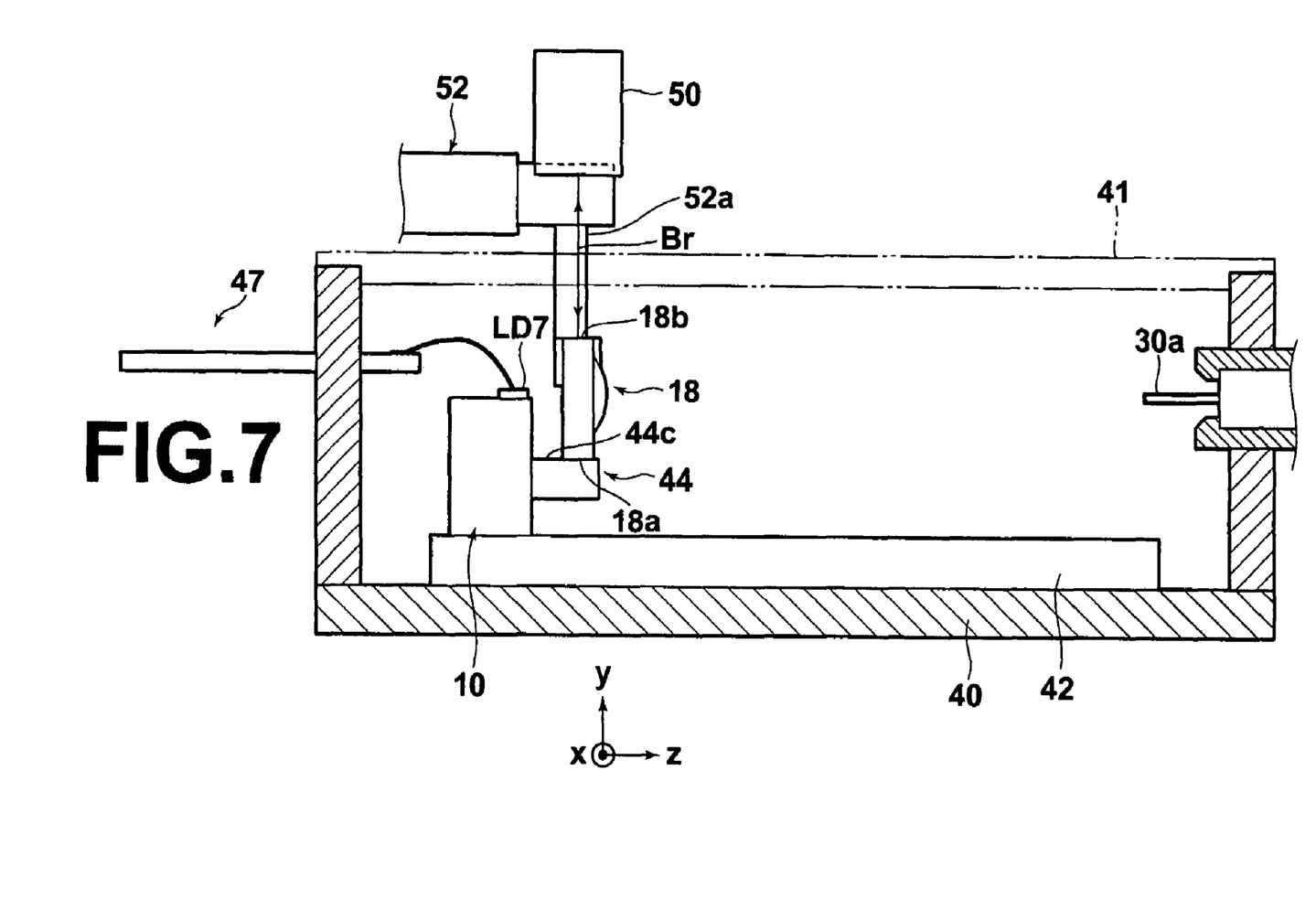
FIG. 7 is a fourth diagram for explaining the method for assembling the laser apparatus.

Next, the collimator-lens array 18 is held by using the mechanical hand 52 in a position in which a lower face 18a (as an adhesion surface) of the collimator-lens array 18 lightly touches the upper face 44c of the collimator-lens holder 44 as illustrated in FIG. 7. While the collimator-lens array 18 is held as above, the angle which an upper face 18b (as a reference surface) of the collimator-lens array 18 makes with the reference direction y is continuously measured in a similar manner to the aforementioned measurement of the angle between the upper face 44c and the reference direction y, and the angle between the upper face 18b and the reference direction y is also determined by the inclination angles $\phi x$ and $\phi z$.

In the operation of holding the collimator-lens array 18, the mechanical hand 52 is controlled so that the continuously measured inclination angles $\phi x$ and $\phi z$ of the upper face 18b respectively coincide with the inclination angles $\phi x$ and $\phi z$ of the upper face 44c, and the collimator-lens array 18 is located at a predetermined position in each of the x- and z-directions. When the collimator-lens array 18 reaches the desired position, the movement of the mechanical hand 52 is stopped, and spots of adhesive are deposited in the gap between the upper face 44c of the collimator-lens holder 44 and the lower face 18a of the collimator-lens array 18. Thus, when the spots of adhesive are cured, the collimator-lens array 18 is adhesively fixed to the upper face 44c.

In order to place the collimator-lens array 18 at the predetermined position in each of the x- and z-directions, it is possible to determine the position of the collimator-lens array 18 in each of the x- and z-directions by making the lower face 18a of the collimator-lens array 18 slide on the upper face 44c of the collimator-lens holder 44. Therefore, the operation of placing the collimator-lens array 18 at the predetermined position in each of the x- and z-directions is not difficult.

The collimator-lens array 18 is formed so that the lower face 18a and the upper face 18b are precisely parallel. In this case, when the inclination angles $\phi x$ and $\phi z$ of the upper face 18*b* of the collimator-lens array 18 respectively coincide with the inclination angles φx and φz of the upper face 44*c* of the collimator-lens holder 44, the lower face 18*a* of the collimator-lens array 18 is parallel with the upper face 44*c*. Therefore, when the collimator-lens array 18 is adhesively fixed to the upper face 44*c* while maintaining the position in which the inclination angles φx and φz of the upper face 18*b* of the collimator-lens array 18 respectively coincide with the inclination angles φx and φz of the upper face 44*c* of the collimator-lens holder 44, the lower face 18*a* of the fixed collimator-lens array 18 becomes precisely parallel with the upper face 44*c* of the collimator-lens holder 44.

In addition, in the above operation for adhesively fixing the collimator-lens array 18, the mechanical hand 52 is further controlled, for example, on the basis of the outer dimensions of the collimator-lens array 18 so that the collimator-lens array 18 reaches a predetermined angular position around the y-axis in which the optical axes of the collimator lenses 11 through 17 become parallel to the core axis of the near-end portion of the multimode optical fiber 30. Thus, the optical axes of the collimator lenses 11 through 17 in the fixed collimator-lens array 18 become parallel to the core axis of the near-end portion of the multimode optical fiber 30.

However, it is difficult to achieve precise alignment between faces of members by only setting the angular position of the collimator-lens array 18 around the y-axis or the angular position of the collimator-lens holder 44 around the z-axis by use of the mechanical hand 52 as explained above. Therefore, according to the present invention, the reference surfaces are used in the operations for adjusting alignment between the faces of members.

When the collimator-lens array 18 is formed by high-precision molding, it is possible to achieve the high precision of approximately ±15" in the parallelism between the lower face 18*a* and the upper face 18*b*. Therefore, when the upper face 18*b* is used as a reference surface in the angle measurement, it is possible to achieve the high precision of approximately ±30" in the parallelism between the lower face 18*a* of the collimator-lens array 18 and the upper face 44*c* of the collimator-lens holder 44. In addition, it is also possible to make the lower face 18*a* and the upper face 18*b* parallel to the direction along which the collimator lenses 11 through 17 are arrayed, with the high precision of approximately ±15".

For example, the adhesive used in the adhesive fixing of the collimator-lens array 18 is also an ultraviolet-curable type organic adhesive. However, since the collimator-lens array 18 (as well as the collimator-lens holder 44) is formed of glass which transmits ultraviolet light, the ultraviolet light for curing the adhesive can transmit through the collimator-lens array 18 and the collimator-lens holder 44, so that the adhesive can be sufficiently irradiated with the ultraviolet light.

When the collimator-lens holder 44 and the collimator-lens array 18 are adhesively fixed to the heat block 10 and the collimator-lens holder 44, respectively, as explained above, the optical axes of the collimator lenses 11 through 17 become parallel to the core axis of the near-end portion of the multimode optical fiber 30 with high precision in the fixed structure.

In the laser apparatus explained above, the heat block 10 and the collimator-lens holder 44 correspond to the aforementioned fixing members fixed to the package in the first aspect of the present invention having the aforementioned additional feature (i).

Referring back to FIG. 2, a method and a structure for fixing the condensing lens 20 by using the condensing-lens holder 46 and the like are explained below.

In this embodiment, the mount 45 (for holding the condensing-lens holder 46) is made of AlN (aluminum nitride) and has a rectangular parallelepipedic shape as the heat block 10. The lower face of the mount 45 is metalized by evaporation of gold, and fixed on the upper surface of the base plate 42 with, for example, Sn48-In52 solder (having the melting temperature of 117° C.) or the like. As mentioned before, the base plate 42 is plated with gold. At this time, the mount 45 is fixed in such a manner that the front face 45*a* of the mount 45 is parallel to the front face 10*b* of the heat block 10. In order to realize this arrangement, it is possible to use the aforementioned method which is used for fixing the collimator-lens holder 44 to the front face 10*b* as illustrated in FIG. 5, and in which the laser autocollimator 50 and the mechanical hand 52 are used.

After the mount 45 is fixed as above, the condensing-lens holder 46 is adhesively fixed to the mount 45, and then the condensing lens 20 is adhesively fixed on an upper face 46*c* of the condensing-lens holder 46. The condensing-lens holder 46 is formed of, for example, ultraviolet-light-transparent glass, and has a rectangular parallelepipedic shape. In order to adhesively fix the condensing-lens holder 46 to the front face 45*a* of the mount 45, it is possible to similarly use the aforementioned method which is used for adhesively fixing the collimator-lens holder 44 to the front face 10*b* of the heat block 10. In the operation for adhesively fixing the condensing-lens holder 46 to the mount 45, a front face 46*b* of the condensing-lens holder 46 is used as a reference surface, and a rear face 46*a* of the condensing-lens holder 46 becomes an adhesion surface. Thus, the condensing-lens holder 46 is adhesively fixed to the front face 45*a* in such a manner that the rear face 46*a* is precisely parallel to the front face 45*a* of the mount 45.

It is possible to form the condensing-lens holder 46 in such a manner that the rear face 46*a* and the front face 46*b* are parallel with the precision of approximately ±15". Such high precision can be realized by polishing the rear face 46*a* and the front face 46*b*.

Next, the condensing lens 20 is adhesively fixed on an upper face 46*c* of the condensing-lens holder 46, which is adhesively fixed to the mount 45 as above. As mentioned before, the condensing lens 20 has a shape elongated in the horizontal direction. In addition, the condensing lens 20 is formed in such a manner that a lower face 20*a* (to be used as an adhesion surface) and an upper face 20*b* (to be used as a reference surface) are precisely parallel. In order to adhesively fix the condensing lens 20 on the upper face 46*c* of the condensing-lens holder 46, it is possible to similarly use the aforementioned method which is used for adhesively fixing the collimator-lens array 18 on the upper face 44*c* of the collimator-lens holder 44. That is, the upper face 20*b* of the condensing lens 20 is used as the reference surface, and the lower face 20*a* (as the adhesion surface) of the condensing lens 20 is adhesively fixed to the upper face 46*c* of the condensing-lens holder 46 so that the lower face 20*a* of the condensing lens 20 becomes precisely parallel to the upper face 46*c* of the condensing-lens holder 46.

It is also possible to form the condensing lens 20 in such a manner that the lower face 20*a* and the upper face 20*b* are parallel with the precision of approximately ±15". Such high precision can be realized by polishing the lower face 20*a* and the upper face 20*b*. In addition, it is also possible to make the lower face 20*a* and the optical axis of the condensing lens 20 parallel with the precision of approximately ±15".

In the laser apparatus explained above, the mount 45 and the condensing-lens holder 46 correspond to the aforementioned fixing members fixed to the package in the first aspect of the present invention having the aforementioned additional feature (i).

Advantages of Embodiment (1) As explained above, the condensing lens 20 is fixed to the condensing-lens holder 46 so that the optical axis of the condensing lens 20 precisely coincides with the optical axis of the near-end portion of the multimode optical fiber 30. In addition, the collimator-lens array 18 is fixed so that the optical axes of the collimator lenses 11 through 17 are precisely parallel to the optical axis of the near-end portion of the multimode optical fiber 30. Therefore, it is possible to ensure high coupling efficiency of the laser beams B1 through B7 to the multimode optical fiber 30.

(2) In the combined laser apparatus according to the present embodiment, the GaN-based semiconductor lasers LD1 through LD7 are fixed to the heat block 10 with Sn—Au solder. Since the Sn—Au solder exhibits high thermal conductivity, the heat generated by the GaN-based semiconductor lasers LD1 through LD7 can be satisfactorily dissipated through the Sn—Au solder to the heat block 10. Since the heat dissipation from the GaN-based semiconductor lasers LD1 through LD7 is sufficient, the temperature at which the GaN-based semiconductor lasers LD1 through LD7 are driven does not become high, and therefore it is possible to prevent deterioration of the output levels and the lifetimes of the GaN-based semiconductor lasers LD1 through LD7. In addition, since the heat block 10 is fixed to the base plate 42 with Sn48-In52 solder, the heat dissipation from the heat block 10 to the base plate 42 is also sufficient, and thus the effect of preventing the deterioration of the output levels and the lifetimes of the GaN-based semiconductor lasers LD1 through LD7 is enhanced.

(3) In the combined laser apparatus according to the present embodiment, the collimator-lens array 18 and the condensing lens 20 (constituting the optical condensing system) are respectively fixed to the collimator-lens holder 44 and the condensing-lens holder 46 with a thin layer of adhesive (i.e., a layer of adhesive having a thickness of less than or equal to 1 micrometer, and preferably a thickness within a range of 0.2 micrometers to 1 micrometer when the adhesive is dried). Therefore, the movement of the collimator-lens array 18 and the condensing lens 20, which occurs in the case where solder is used for fixing, does not occur, and thus the precision of the positions of the collimator-lens array 18 and the condensing lens 20 is maintained at a high level. In addition, since the collimator-lens holder 44 and the condensing-lens holder 46 are also fixed with a thin layer of adhesive to the heat block 10 and the mount 45, respectively, the precision of the positions of the collimator-lens holder 44 and the condensing-lens holder 46 is also maintained at a high level.

(4) In the case where the heat block 10 and the mount 45 are fixed to the base plate 42 on the package 40 with Sn48-In52 solder, the precision of the positions of the heat block 10 and the mount 45 with respect to the package 40 is likely to be lower than the precision in the case where the heat block 10 and the mount 45 are fixed with an adhesive. However, even in the case where the precision of the positions of the heat block 10 and the mount 45 with respect to the package 40 is low, it is possible to precisely align the positions of the collimator-lens holder 44 and the condensing-lens holder 46 with the heat block 10 and the mount 45, respectively, and align the positions of the collimator-lens array 18 and the condensing lens 20 with the collimator-lens holder 44 and the condensing-lens holder 46, respectively, when the collimator-lens holder 44, the condensing-lens holder 46, the collimator-lens holder 44, and the condensing-lens holder 46 are adhesively fixed. Thus, the precision of the positions of the collimator-lens array 18 and the condensing lens 20 with respect to the multimode optical fiber 30 can be maintained at a high level.

(5) When the heat block 10 and the mount 45 are fixed to base plate 42 in the present embodiment, the Sn48-In52 solder having the melting temperature of 117° C. is used and melted by heating the Sn48-In52 solder to a temperature lower than the melting temperature (280° C.) of the Sn—Au solder used for fixing the GaN-based semiconductor lasers LD1 through LD7 and the melting temperature (220° C.) of the Sn-3.5Ag-0.5Cu solder used for fixing the ferrule 31. Therefore, even when the heat applied for melting the Sn48-In52 solder is transferred to the Sn—Au solder or the Sn-3.5Ag-0.5Cu solder, neither the Sn—Au solder nor the Sn-3.5Ag-0.5Cu solder is melted, and thus none of the GaN-based semiconductor lasers LD1 through LD7 and the ferrule 31 moves. That is, no problem occurs even when the heat applied for melting the Sn48-In52 solder in order to fix the heat block 10 and the mount 45 to the base plate 42 is transferred to the entire package 40. Therefore, the operation for melting the solder in order to fix the heat block 10 and the mount 45 to base plate 42 is simplified.

(6) In the present invention, it is possible to use an identical type of solder having an identical melting temperature in different positions when operations for fixing elements are performed in the different positions at different times. In this case, procurement and management of the solder are simplified. However, it is necessary to melt the solder in each position by locally heating the position in such a manner that heat is not transferred to other positions in which elements are already fixed with solder.

(7) In the laser apparatus according to the present embodiment, the fixing structure for the collimator-lens array 18 is constituted by the heat block 10 and the collimator-lens holder 44, where the heat block 10 has the front face 10b as a guide surface extending in the direction perpendicular to the core axis of the multimode optical fiber 30, and the collimator-lens holder 44 has the upper face 44c as a guide surface extending in the direction parallel to the core axis of the multimode optical fiber 30. Therefore, it is possible to easily adjust the position of the collimator-lens array 18 with respect to the core axis of the multimode optical fiber 30 by moving the collimator-lens holder 44 along the front face 10b of the heat block 10 in the direction perpendicular to the core axis of the multimode optical fiber 30, and moving the collimator-lens array 18 along the upper face 44c of the collimator-lens holder 44 in the direction parallel to the core axis of the multimode optical fiber 30, before fixing the collimator-lens array 18.

In addition, according to the present embodiment, the fixing structure for the condensing lens 20 is constituted by the mount 45 and the condensing-lens holder 46, where the mount 45 has the front face 45a as a guide surface extending in the direction perpendicular to the core axis of the multimode optical fiber 30, and the condensing-lens holder 46 has the upper face 46c as a guide surface extending in the direction parallel to the core axis of the multimode optical fiber 30. Therefore, it is possible to easily adjust the position of the condensing lens 20 with respect to the core axis of the multimode optical fiber 30 by moving the condensing-lens holder 46 along the front face 45a of the mount 45 in the direction perpendicular to the core axis of the multimode optical fiber 30, and moving the condensing lens 20 along the upper face 46c of the condensing-lens holder 46 in the direction parallel to the core axis of the multimode optical fiber 30, before fixing the condensing lens 20.

(8) Since the collimator-lens array 18 and the condensing lens 20 constituting the optical condensing system can be adjusted to optimum positions with respect to the core axis of the multimode optical fiber 30 as explained above, it is possible to adjust the collimator-lens array 18 and the condensing lens 20 at respectively optimum positions with respect to the core axis of the multimode optical fiber 30. Therefore, the multimode optical fiber 30 is merely required to be fixed to the sidewall of the package 40 through the ferrule 31. That is, it is unnecessary to provide a mechanism for positioning the optical fiber outside the package. Thus, it is possible to reduce the size of the laser apparatus.

Additional Matters (1) It is possible to directly fix the multimode optical fiber 30 to the sidewall of the package 40 without the ferrule 31.

(2) In the above explanations, the inclinations of the collimator-lens array 18 and the condensing lens 20 are measured during assembly by using the reference surfaces as explained above. Further, even after completion of the assembly, the inclinations of the collimator-lens array 18 and the condensing lens 20 can be measured by using the reference surfaces in order to determine whether the assembled laser apparatus is nondefective or defective. Furthermore, the inclinations of the collimator-lens array 18 and the condensing lens 20 can be measured by using the reference surfaces during reassembly which is performed after the assembled laser apparatus is disassembled.

(3) In order to realize satisfactory reflection of the laser beam Br and suppress scattering during the measurement with respect to the reference direction, it is desirable that the reference surfaces used in the measurement be mirror finished with an arithmetic average roughness (Ra) smaller than 0.08 micrometers. In the present embodiment, such reference surfaces include the front face 10b of the heat block 10, the front face 44b and the upper face 44c of the collimator-lens holder 44, the upper face 18b of the collimator-lens array 18, the front face 45a of the mount 45, the front face 46b and the upper face 46c of the condensing-lens holder 46, and the upper face 20b of the condensing lens 20. When the reference surfaces are finished as above, it is possible to measure the angles with respect to the reference direction with the precision of approximately ±5".

On the other hand, in order to realize satisfactory penetration of the adhesive into the gaps between the adhesion surfaces and the reference surfaces, it is desirable that the adhesion surfaces to be adhered to the reference surfaces be rougher than the reference surfaces. In the present embodiment, such adhesion surfaces include the rear face 44a of the collimator-lens holder 44, the lower face 18a of the collimator-lens array 18, the rear face 46a of the condensing-lens holder 46, and the lower face 20a of the condensing lens 20. For example, when the reference surfaces are mirror finished with an arithmetic average roughness (Ra) smaller than 0.08 micrometers, it is desirable that the adhesion surfaces to be adhered to such reference surfaces have an arithmetic average roughness (Ra) of 0.15 to 0.35 micrometers. The arithmetic average roughness (Ra) can be measured, for example, by using a stylus-type roughness measurement device.

(4) Although the reference surface in each fixing member is set parallel to a mounting surface or an adhesion surface in the fixing member in the above embodiment, alternatively, it is possible to set a reference surface in each fixing member so as to form a predetermined angle (e.g., 90 degrees) with a mounting surface or an adhesion surface in the fixing member corresponding to the reference surface.

(5) Temperature variations occurring during use or storage of the laser apparatus can produce thermal stress in a portion of the collimator-lens holder 44 at which the collimator-lens holder 44 is adhered to the heat block 10. In order to reduce such thermal stress, it is desirable that the collimator-lens holder 44 be formed of glass having a linear expansion coefficient close to the linear expansion coefficient of AlN, of which the heat block 10 is formed. Similarly, it is desirable that the collimator-lens array 18 be formed of glass having a linear expansion coefficient close to the linear expansion coefficient of the glass of which the collimator-lens holder 44 is formed. For the same reason, it is desirable that the condensing-lens holder 46 be formed of glass having a linear expansion coefficient close to the linear expansion coefficient of AlN, of which the mount 45 is formed, and the condensing lens 20 be formed of glass having a linear expansion coefficient close to the linear expansion coefficient of the glass of which the condensing-lens holder 46 is formed.

(6) Although the heat block 10 and the mount 45 are formed of AlN in the above embodiment, it is also preferable to form the heat block 10 and the mount 45 of copper or a copper alloy. Further, it is possible to integrally form the heat block 10 and the mount 45.

(7) A combined laser apparatus comprising a single lens which has the functions of both of the collimator-lens array and the condensing lens is disclosed, for example, in Japanese Unexamined Patent Publication No. 2003-347647 referred to before. Although the collimator-lens array 18 and the condensing lens 20 are separately formed in the above embodiment, the present invention can also be applied to the combined laser apparatus in which the functions of both of the collimator-lens array and the condensing lens are realized by a single lens.

Figure 8:
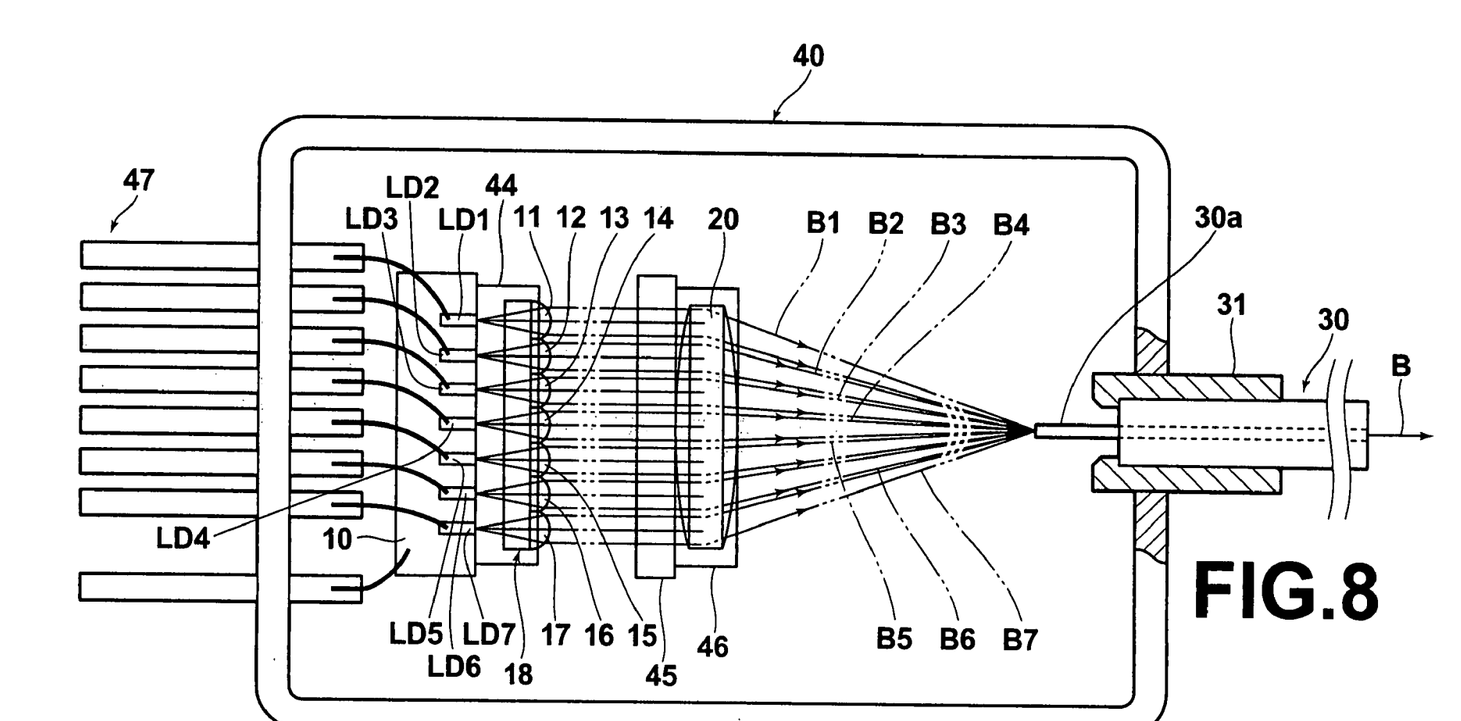
FIG. 8 is a plan view, partly in cross section, of a variation of the laser apparatus according to the embodiment of the present invention.
Figure 9:
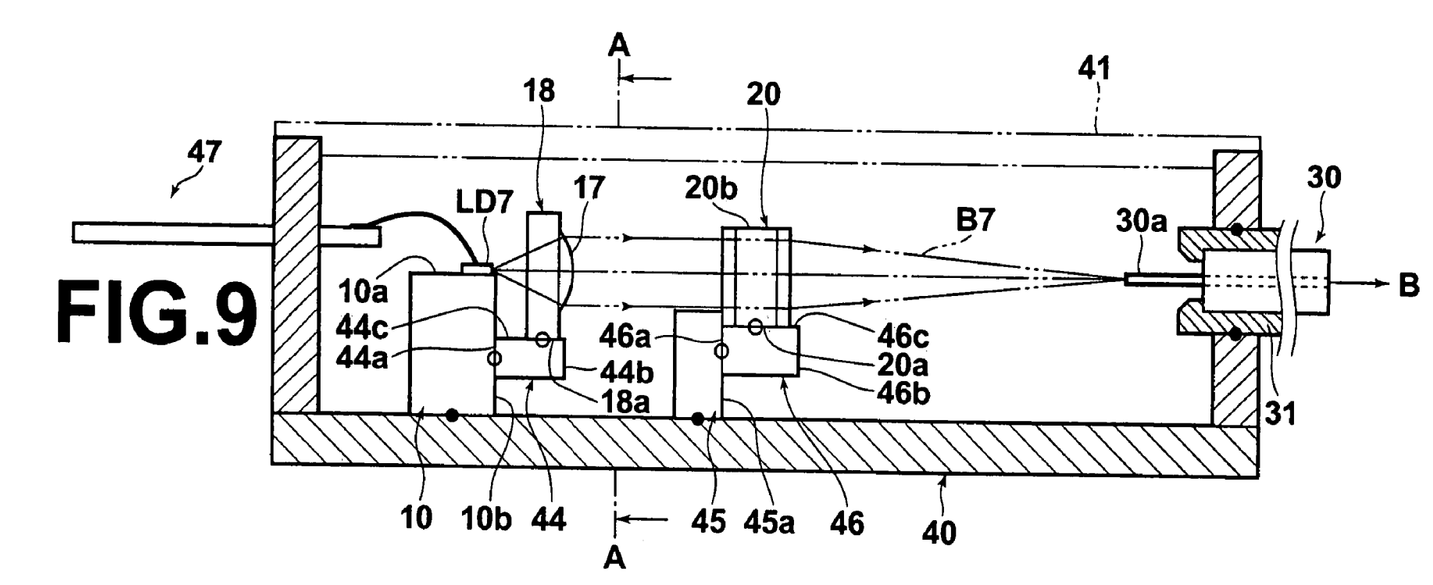
FIG. 9 is a side view, partly in cross section, of the laser apparatus of FIG. 8.

(8) Although, in the combined laser apparatus according to the above embodiment, the base plate 42 is fixed to the bottom surface of the package 40, and the heat block 10 and the mount 45 are fixed on the upper surface of the base plate 42, the base plate 42 can be dispensed with. That is, the heat block 10 and the mount 45 may be directly fixed to the bottom surface of the package 40 as illustrated in FIGS. 8 and 9.

(9) Although the present invention is applied to a combined laser apparatus in the above embodiment, the present invention can also be applied to laser apparatuses in which a single laser beam emitted from a semiconductor laser is condensed and coupled to an optical fiber.

(10) This application is based upon and claims the benefits of priority from the Japanese patent application No. 2005-082180, the entire contents of which are incorporated herein by reference.

What is claimed is:

1. A laser apparatus comprising:
    one or more semiconductor lasers which emit one or more laser beams;
    an optical fiber;
    an optical condensing system which is constituted by one or more optical components, condenses said one or more laser beams emitted from said one or more semiconductor lasers, and makes the one or more laser beams enter said optical fiber from a light-entrance end of the optical fiber; and
    a package which fixedly contains said optical condensing system and said one or more semiconductor lasers, and fixedly holds said optical fiber in such a manner that said light-entrance end faces said optical condensing system;

wherein said one or more optical components are directly or indirectly fixed to said package with a first layer of adhesive, said one or more semiconductor lasers are directly or indirectly fixed to said package with solder, and the first layer of adhesive has a thickness of less than or equal to 1 micrometer, and preferably a thickness within a range of 0.2 micrometers to 1 micrometer after the first layer of adhesive is dried.

2. A laser apparatus according to claim 1, wherein at least part of said one or more optical components and said one or more semiconductor lasers are fixed to said package through fixing members which are fixed to the package.

3. A laser apparatus according to claim 2, wherein said fixing members are fixed to the package with solder.

4. A laser apparatus according to claim 2, further comprising one or more holders which are fixed with a second layer of adhesive to one or more fixing members fixed to said package, where said one or more optical components constituting said optical condensing system are fixed to the one or more holders with a third layer of adhesive, and each of the second and third layers of adhesive has a thickness of less than or equal to 1 micrometer, and preferably a thickness within a range of 0.2 micrometers to 1 micrometer after said each of the second and third layers of adhesive is dried.

5. A laser apparatus according to claim 3, further comprising one or more holders which are fixed with a second layer of adhesive to one or more fixing members fixed to said package, where said one or more optical components constituting said optical condensing system are fixed to the one or more holders with a third layer of adhesive, and each of the second and third layers of adhesive has a thickness of less than or equal to 1 micrometer, and preferably a thickness within a range of 0.2 micrometers to 1 micrometer after said each of the second and third layers of adhesive is dried.

6. A laser apparatus according to claim 1, wherein a plurality of elements including said one or more semiconductor lasers are directly or indirectly fixed to said package with an identical type of solder having an identical melting temperature.

7. A laser apparatus according to claim 2, wherein a plurality of elements including said one or more semiconductor lasers are fixed to said package or one or more fixing members fixed to the package, with an identical type of solder having an identical melting temperature.

8. A laser apparatus according to claim 3, wherein a plurality of elements including said one or more semiconductor lasers are fixed to said package or one or more fixing members fixed to the package, with an identical type of solder having an identical melting temperature.

9. A laser apparatus according to claim 4, wherein a plurality of elements including said one or more semiconductor lasers are fixed to said package or one or more fixing members fixed to the package, with an identical type of solder having an identical melting temperature.

10. A laser apparatus according to claim 1, wherein a plurality of elements including said one or more semiconductor lasers are directly or indirectly fixed to said package with different types of solder having different melting temperatures, respectively.

11. A laser apparatus according to claim 2, wherein a plurality of elements including said one or more semiconductor lasers are fixed to said package or one or more fixing members fixed to the package, with different types of solder having different melting temperatures, respectively.

12. A laser apparatus according to claim 3, wherein a plurality of elements including said one or more semiconductor lasers are fixed to said package or one or more fixing members fixed to the package, with different types of solder having different melting temperatures, respectively.

13. A laser apparatus according to claim 4, wherein a plurality of elements including said one or more semiconductor lasers are fixed to said package or one or more fixing members fixed to the package, with different types of solder having different melting temperatures, respectively.

14. A laser apparatus according to claim 10, wherein said different types of solder include at least two of Sn48-In52 solder having a melting temperature of 117° C., Sn-3.5Ag-0.5Cu solder having a melting temperature of 220° C., and Sn—Au solder having a melting temperature of 280° C.

15. A laser apparatus according to claim 11, wherein said different types of solder include at least two of Sn48-In52 solder having a melting temperature of 117° C., Sn-3.5Ag-0.5Cu solder having a melting temperature of 220° C., and Sn—Au solder having a melting temperature of 280° C.

16. A laser apparatus according to claim 12, wherein said different types of solder include at least two of Sn48-In52 solder having a melting temperature of 117° C., Sn-3.5Ag-0.5Cu solder having a melting temperature of 220° C., and Sn—Au solder having a melting temperature of 280° C.

17. A laser apparatus according to claim 13, wherein said different types of solder include at least two of Sn48-In52 solder having a melting temperature of 117° C., Sn-3.5 Ag-0.5Cu solder having a melting temperature of 220° C., and Sn—Au solder having a melting temperature of 280° C.

* * * * *